(12) United States Patent
Kato et al.

(10) Patent No.: US 6,771,530 B2
(45) Date of Patent: Aug. 3, 2004

(54) SEMICONDUCTOR MEMORY AND METHOD FOR DRIVING THE SAME

(75) Inventors: Yoshihisa Kato, Otsu (JP); Yasuhiro Shimada, Muko (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/886,972

(22) Filed: Jun. 25, 2001

(65) Prior Publication Data

US 2001/0055822 A1 Dec. 27, 2001

(30) Foreign Application Priority Data

Jun. 27, 2000 (JP) ........................................ 2000-192464

(51) Int. Cl.[7] .......................... G11C 11/22; G11C 5/06; G11C 16/04; G11C 7/02
(52) U.S. Cl. .................... 365/145; 365/65; 365/185.18; 365/214
(58) Field of Search ........................... 365/145, 185.18, 365/65, 214, 173

(56) References Cited

U.S. PATENT DOCUMENTS

| | | | | |
|---|---|---|---|---|
| 4,298,960 A | * | 11/1981 | Mitake et al. | 365/210 |
| 5,163,022 A | * | 11/1992 | Homma et al. | 365/190 |
| 5,196,912 A | * | 3/1993 | Matsumoto et al. | 257/16 |
| 5,753,946 A | * | 5/1998 | Naiki et al. | 257/295 |
| 5,780,886 A | * | 7/1998 | Yamanobe | 257/295 |
| 5,959,879 A | * | 9/1999 | Koo | 257/295 |
| 6,049,477 A | * | 4/2000 | Taira | 257/295 |
| 6,140,672 A | * | 10/2000 | Arita et al. | 257/295 |
| 6,144,579 A | * | 11/2000 | Taira | 257/295 |
| 6,151,241 A | * | 11/2000 | Hayashi et al. | 365/145 |
| 6,157,563 A | * | 12/2000 | Hirano et al. | 365/145 |
| 6,172,918 B1 | * | 1/2001 | Hidaka | 365/189.11 |
| 6,285,577 B1 | * | 9/2001 | Nakamura | 365/145 |
| 6,335,876 B1 | * | 1/2002 | Shuto | 365/145 |
| 6,362,500 B2 | * | 3/2002 | Ishiwara | 257/295 |
| 6,498,362 B1 | * | 12/2002 | Forbes et al. | 257/295 |

FOREIGN PATENT DOCUMENTS

JP       61061297 A * 3/1986 ........... G11C/17/00

* cited by examiner

Primary Examiner—David Nelms
Assistant Examiner—Ly Duy Pham
(74) Attorney, Agent, or Firm—Nixon Peabody LLP; Donald R. Studebaker

(57) ABSTRACT

A method for driving a semiconductor memory including a field effect transistor having a gate electrode formed on a ferroelectric film includes the steps of writing a data in the semiconductor memory by changing a polarized state of the ferroelectric film by applying a voltage to the gate electrode, and reading a data written in the semiconductor memory by detecting a current change appearing between a drain and a source of the field effect transistor by applying a voltage between the drain and the source of the field effect transistor with a voltage applied to the gate electrode. The magnitude of the voltage applied between the drain and the source of the field effect transistor in the step of reading a data is set within a range where a drain-source current of the field effect transistor increases as a drain-source voltage thereof increases.

2 Claims, 4 Drawing Sheets

|  | OPERATION | | |
| --- | --- | --- | --- |
|  | ERASE | WRITE | READ |
| WL | $V_G$ | $V_G$ | 0 |
| RL | 0 | 0 | $V_G$ |
| GL | 0 | $V_P$ | 0 |
| BL | 0 | 0 | $V_d$ |
| SUBSTRATE | $-V_{GE}$ | 0 | 0 |

SEMICONDUCTOR MEMORY AND METHOD FOR DRIVING THE SAME

BACKGROUND OF THE INVENTION

1. Field of the Invention

The present invention relates to a nonvolatile semiconductor memory and a method for driving the same. More particularly, it relates to a semiconductor memory composed of an MFS transistor including a field effect transistor having a gate electrode formed on a ferroelectric film, an MFIS transistor including a field effect transistor having a gate electrode formed on a multi-layer film of a ferroelectric film and a dielectric film or an MFMIS transistor including a ferroelectric capacitor formed on a gate electrode of a field effect transistor, and a method for driving the same.

2. Description of the Related Art

Known one-transistor type nonvolatile semiconductor memories having a ferroelectric film are three types of transistors, that is, an MFS transistor, an MFIS transistor and an MFMIS transistor.

An MFS transistor has a Metal/Ferroelectric/Semiconductor multi-layer structure and includes a gate insulating film of a ferroelectric film directly formed on a channel region of a semiconductor substrate.

An MFIS transistor has a Metal/Ferroelectric/Insulator/Semiconductor multi-layer structure and includes a dielectric film serving as a buffer layer formed between a gate insulating film of a ferroelectric film and a semiconductor substrate. The MFIS transistor is improved in the surface characteristic as compared with the MFS transistor.

An MFMIS transistor has a Metal/Ferroelectric/Metal/Insulator/Semiconductor multi-layer structure and includes a ferroelectric capacitor formed on a gate electrode of a field effect transistor having the MOS structure. The MFMIS transistor is formed in either of the following two known structures: In the first structure, the ferroelectric capacitor is formed above the gate electrode of the field effect transistor with an insulating film sandwiched therebetween; and in the second structure, the gate electrode of the field effect transistor also works as the lower electrode of the ferroelectric capacitor.

In a memory cell using, as a data storing transistor, a one-transistor type nonvolatile semiconductor memory having a ferroelectric film (namely, a nonvolatile memory), the memory cell is constructed by connecting a transistor for gate selection and a transistor for source selection to a data storing transistor of an MFS transistor as disclosed in, for example, Japanese Patent No. 2921812.

FIG. 6 shows the circuit configuration of the one-transistor type nonvolatile semiconductor memory described in Japanese Patent No. 2921812. In FIG. 6, WL denotes a word line for write, RL denotes a word line for read, GL denotes an operation voltage supply line, BL denotes a bit line, $Q_1$ denotes a data storing transistor, $Q_2$ denotes a writing transistor and $Q_3$ denotes a reading transistor.

The gate of the data storing transistor $Q_1$ is connected to the operation voltage supply line GL through the writing transistor $Q_2$, the drain of the data storing transistor $Q_1$ is connected to the bit line BL through the reading transistor $Q_3$, and the source of the data storing transistor $Q_1$ is grounded. A memory cell array is formed by arranging a plurality of memory cells each having this circuit configuration on a silicon substrate.

A data erase operation, a data write operation and a data read operation of the memory cell having this circuit configuration will now be described with reference to FIG. 7.

In the data erase operation, negative potential is applied to a well region of a semiconductor substrate so as to apply a voltage between the gate of each data storing transistor $Q_1$ and the substrate. Thus, the polarization of ferroelectric films are turned along the same direction. In this manner, data stored in all the memory cells are erased.

In the data write operation, a voltage is applied between the substrate and the gate of the data storing transistor $Q_1$ of the memory cell disposed in an address selected by the writing transistor $Q_2$, so as to reverse the polarization direction of the ferroelectric film of this transistor (to place it in an on-state) or the polarization direction of the ferroelectric film of the transistor is kept (to place it in an off-state) without applying the voltage between the gate and the substrate. Specifically, a data is written by causing either of two kinds of polarized states, that is, to reverse the polarization (which corresponds to an on-state) and to keep the polarization (which corresponds to an off-state) in accordance with the input data. Since the polarized state of the ferroelectric film is kept without applying a voltage, the memory cell functions as a nonvolatile semiconductor memory.

In the data read operation, the reading transistor $Q_3$ is turned on, so as to detect voltage drop accompanied by a current flowing from the bit line BL through the channel of the data storing transistor $Q_1$ to a ground line (namely, a drain-source current). Since the channel resistance is varied depending upon the polarized state of the ferroelectric film of the data storing transistor $Q_1$, a data written in the data storing transistor $Q_1$ can be thus read.

In driving the nonvolatile semiconductor memory, the efficiency of the read operation is improved by setting the threshold voltage of the data storing transistor $Q_1$ to a gate voltage $V_G$ for maximizing a difference between the drain-source current $I_{ds}$ on a subthreshold curve of the data storing transistor $Q_1$ obtained when the polarization direction of the ferroelectric film is reversed (namely, in an on-state) and the drain-source current $I_{ds}$ on a subthreshold curve of the data storing transistor $Q_1$ obtained when the polarization direction of the ferroelectric film is not reversed (namely, in an off-state).

The conventional nonvolatile semiconductor memory, however, has an unavoidable problem that a read voltage is lowered (namely, a drain-source voltage is lowered) with time.

SUMMARY OF THE INVENTION

In consideration of the conventional problem, an object of the invention is improving the retention characteristic of a nonvolatile semiconductor memory, namely, improving (a drain-source current $I_{ds}'$ after time)/(a drain-source current $I_{ds}$ in initial state), by suppressing the phenomenon that the read voltage is lowered with time.

In order to achieve the object, the present inventors have carried out experiments with paying attention to a read voltage (a drain-source voltage) employed in a read operation, which is conventionally minimally considered. As a result, it has been found that degradation of a drain-source current $I_{DS}$ can be suppressed by setting the read voltage to a value belonging to a drain non-saturated region (i.e., a region where the drain-source current depends upon the drain-source voltage) of a field effect transistor included in a semiconductor memory. The method for driving a semiconductor memory of this invention was devised on the basis of this finding.

Specifically, the first method of this invention for driving a semiconductor memory composed of an MFS transistor including a field effect transistor having a gate electrode formed on a ferroelectric film or an MFIS transistor including a field effect transistor having a gate electrode formed on a multi-layer film of a ferroelectric film and a dielectric film, comprises the steps of writing a data in the semiconductor memory by changing a polarized state of the ferroelectric film by applying a voltage to the gate electrode; and reading a data written in the semiconductor memory by detecting a current change appearing between a drain and a source of the field effect transistor by applying a voltage between the drain and the source of the field effect transistor with a voltage applied to the gate electrode, and magnitude of the voltage applied between the drain and the source of the field effect transistor in the step of reading a data is set within a range where a drain-source current of the field effect transistor increases as a drain-source voltage thereof increases.

The second method of this invention for driving a semiconductor memory composed of an MFMIS transistor including a ferroelectric capacitor formed above a gate electrode of a field effect transistor and having a control gate composed of an upper electrode of the ferroelectric capacitor, comprises the steps of writing a data in the semiconductor memory by changing a polarized state of a ferroelectric film of the ferroelectric capacitor by applying a voltage to the control gate; and reading a data written in the semiconductor memory by detecting a current change appearing between a drain and a source of the field effect transistor by applying a voltage between the drain and the source of the field effect transistor with a voltage applied to the control gate, and magnitude of the voltage applied between the drain and the source of the field effect transistor in the step of reading a data is set within a range where a drain-source current of the field effect transistor increases as a drain-source voltage thereof increases.

In the first or second method for driving a semiconductor memory of this invention, the magnitude of the voltage applied between the drain and the source of the field effect transistor in the step of reading a data, namely, the magnitude of the read voltage, is set within the range where the drain-source current of the field effect transistor increases as the drain-source voltage of the field effect transistor increases. Accordingly, the lowering of the drain-source current with time can be suppressed.

The first semiconductor memory of this invention composed of an MFS transistor including a field effect transistor having a gate electrode formed on a ferroelectric film or an MFIS transistor including a field effect transistor having a gate electrode formed on a multi-layer film of a ferroelectric film and a dielectric film, comprises first voltage supply means for supplying a first voltage to the gate electrode for changing a polarized state of the ferroelectric film in data write; and second voltage supply means for supplying a second voltage between a drain and a source of the field effect transistor in data read, and magnitude of the second voltage supplied by the second voltage supply means is set within a range where a drain-source current of the field effect transistor increases as a drain-source voltage thereof increases.

The second semiconductor memory of this invention composed of an MFMIS transistor including a ferroelectric capacitor formed above a gate electrode of a field effect transistor, comprises a control gate composed of an upper electrode of the ferroelectric capacitor; first voltage supply means for supplying a first voltage to the control gate for changing a polarized state of the ferroelectric film in data write; and second voltage supply means for supplying a second voltage between a drain and a source of the field effect transistor in data read, and magnitude of the second voltage supplied by the second voltage supply means is set within a range where a drain-source current of the field effect transistor increases as a drain-source voltage thereof increases.

In the first or second semiconductor memory of this invention, the magnitude of the second voltage applied between the drain and the source of the field effect transistor by the second voltage supply means in the data read is set within the range where the drain-source current of the field effect transistor increases as the drain-source voltage of the field effect transistor increases. Accordingly, the lowering of the drain-source current with time can be suppressed.

DETAILED DESCRIPTION OF THE INVENTION

A method for driving a semiconductor memory according to a preferred embodiment of the invention will now be described by exemplifying a driving method for an MFIS transistor.

Figure 1:
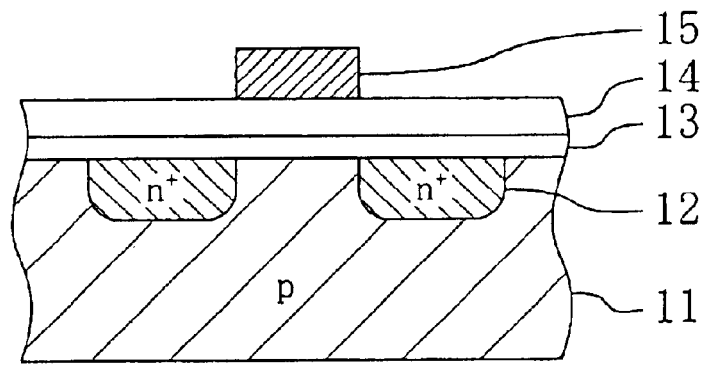
FIG. 1 is a cross-sectional view of an MFIS transistor to be driven by a method for driving a semiconductor memory according to an embodiment of the invention.

As shown in FIG. 1, a pair of n-type dopant diffusion layers 12 serving as a drain and a source are formed in surface portions of a p-type semiconductor substrate 11 of silicon. On the semiconductor substrate 11, a dielectric film 13 of $CeO_2$ with a thickness of 20 nm and a ferroelectric film 14 of $SrBi_2Ta_2O_9$ with a thickness of 200 nm are successively formed, so as to form a gate insulating film from the dielectric film 13 and the ferroelectric film 14. A gate electrode 15 of aluminum is formed on a region of the gate insulating film sandwiched between the pair of n-type dopant diffusion layers 12, and the gate electrode 15 has a gate length of 7 $\mu$m and a gate width of 5 $\mu$m.

Figure 2:
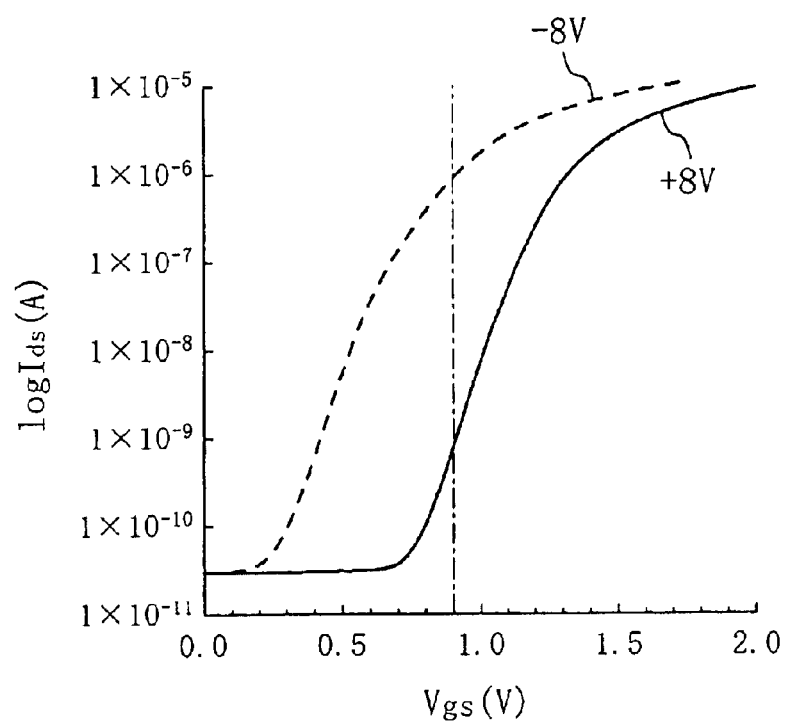
FIG. 2 is a $V_{gs}$-$I_{ds}$ characteristic diagram obtained by measuring a drain-source current with a gate-source voltage varied from 0 V to 2 V after applying a voltage of +8 V or −8 V to the gate electrode of the MFIS transistor to be driven by the method for driving a semiconductor memory of the embodiment.

In FIG. 2, a solid curve denotes a $V_{gs}$-$I_{ds}$ characteristic obtained by measuring a drain-source current $I_{ds}$ with a gate-source voltage $V_{gs}$ varied from 0 V to 2 V after applying a voltage of +8 V to the gate electrode 15 of the MFIS transistor having the aforementioned structure, and a broken curve denotes a $V_{gs}$-$I_{ds}$ characteristic obtained by measuring a drain-source current Ids with a gate-source voltage $V_{gs}$ varied from 0 V to 2 V after applying a voltage of −8 V to the gate electrode 15 of the MFIS transistor having the aforementioned structure.

As obvious from FIG. 2, a voltage difference $V_t$ between the gate-source voltage $V_{gs}$ obtained by applying a voltage of +8 V to the gate electrode 15 (namely, in an on-state) and the gate-source voltage $V_{gs}$ obtained by applying a voltage of −8 V to the gate electrode 15 (namely, in an off-state) is 0.6 V. Also, when the gate-source voltage $V_{gs}$ applied in a read operation is set to 0.9 V, the drain-source current Ids obtained in an on-state is approximately $10^3$ times as large as the drain-source current $I_{ds}$ obtained in an off-state. In other words, when the gate voltage is set to 0.9 V in a read operation, (the drain-source current in an on-state)/(the drain-source current in an off-state) is approximately $1\times10^3$.

Figure 3:
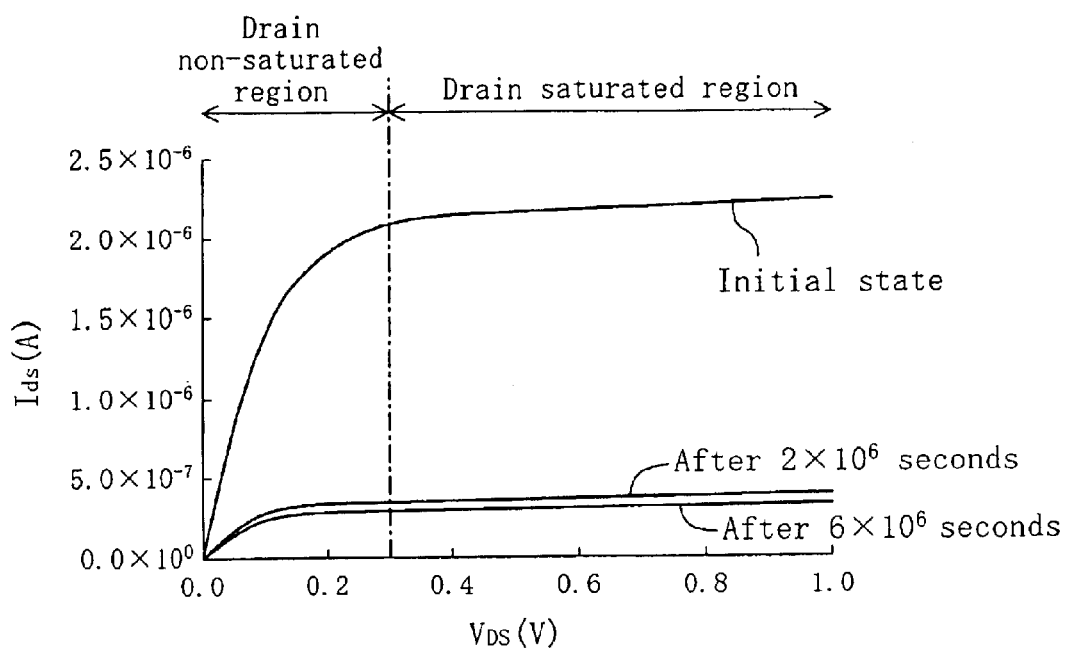
FIG. 3 is a diagram for showing the relationship between a drain-source voltage and a drain-source current obtained in the initial state of the MFIS transistor to be driven by the method for driving a semiconductor memory of the embodiment, obtained after allowing the MFIS transistor to stand for $2 \times 10^6$ seconds at room temperature from the initial state and obtained after allowing the MFIS transistor to stand for $6 \times 10^6$ seconds at room temperature from the initial state.

FIG. 3 shows the relationship between a drain-source voltage $V_{DS}$ and a drain-source current $I_{DS}$ of the MFIS transistor obtained in the initial state, obtained after allowing the MFIS transistor to stand for $2\times10^6$ seconds at room temperature from the initial state and obtained after allowing the MFIS transistor to stand for $6\times10^6$ seconds at room temperature from the initial state. As understood from FIG. 3, when the MFIS transistor is allowed to stand at room temperature for a long period of time, the drain-source current $I_{DS}$ is lowered to approximately 1/10 of that obtained in the initial state because of charge loss and polarization degradation derived from leakage in the ferroelectric film.

Figure 4:
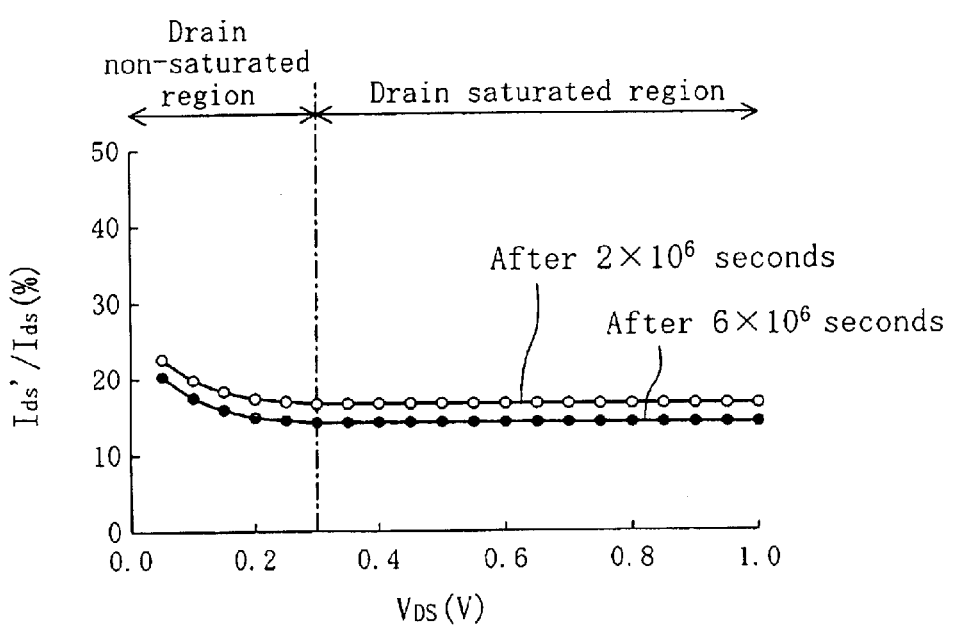
FIG. 4 is a diagram for showing a ratio of a drain-source current obtained, in the MFIS transistor to be driven by the method for driving a semiconductor memory of the embodiment, after allowing the MFIS transistor to stand for $2 \times 10^6$ seconds or $6 \times 10^6$ seconds to a drain-source current obtained in the initial state.

FIG. 4 shows the ratio of a drain-source current $I_{DS}'$ obtained after $2\times10^6$ seconds or $6\times10^6$ seconds to the drain-source current $I_{DS}$ obtained in the initial state ($I_{DS}'/I_{DS}$).

In FIGS. 3 and 4, a drain non-saturated region means a region where the drain-source current depends upon the drain-source voltage, and a drain saturated region means a region where the drain-source current does not depend upon the drain-source voltage. In other words, the drain non-saturated region means a region where the drain-source current $I_{DS}$ increases as the drain-source voltage $V_{DS}$ increases, and the drain saturated region means a region where the drain-source current $I_{DS}$ minimally increases even when the drain-source voltage $V_{DS}$ increases. In FIGS. 3 and 4, a region where the drain-source voltage $V_{DS}$ is 0.3 V or lower corresponds to the drain non-saturated region, and a region where the drain-source voltage $V_{DS}$ is higher than 0.3 V corresponds to the drain saturated region.

It is understood from FIG. 4 that the ratio $I_{DS}'/I_{DS}$ is larger in the drain non-saturated region (namely, the region where $V_{DS} \leq 0.3$ V) than in the drain saturated region (namely, the region where $V_{DS} > 0.3$ V), and is approximately 20% when the source-drain voltage $V_{sd}$ is 0.1 V.

Accordingly, it is understood that the lowering of the drain-source current $I_{DS}'$ can be more largely suppressed by setting the read voltage (the source-drain voltage $V_{sd}$) to a value belonging to the drain non-saturated region than by setting the read voltage to a value belonging to the drain saturated region, and that the source-drain current can be kept at approximately 20% of that attained in the initial sate by setting the gate-source voltage $V_{gs}$ employed in a read operation to 0.9 V and the read voltage to 0.1 V.

Although the MFIS transistor is exemplified in this embodiment, the method for driving a semiconductor memory of this embodiment is similarly applicable to an MFS transistor and an MFMIS transistor in addition to the MFIS transistor.

A semiconductor memory for realizing the aforementioned driving method will now be described with reference to FIG. 5.

Figure 5:
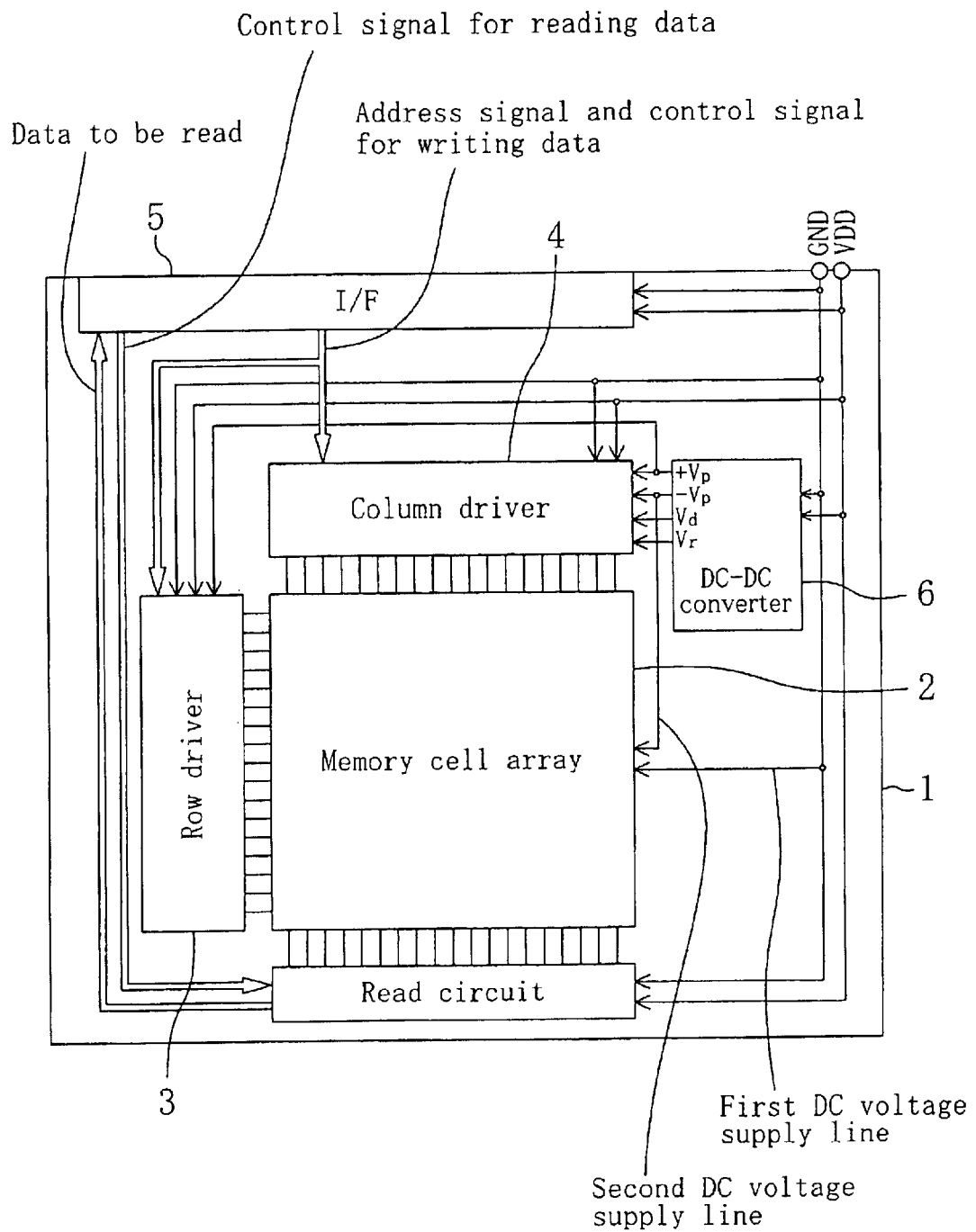
FIG. 5 is a plane view of a semiconductor chip mounting a memory cell array including a semiconductor memory according to the embodiment of the invention.
Figures 6, 7:
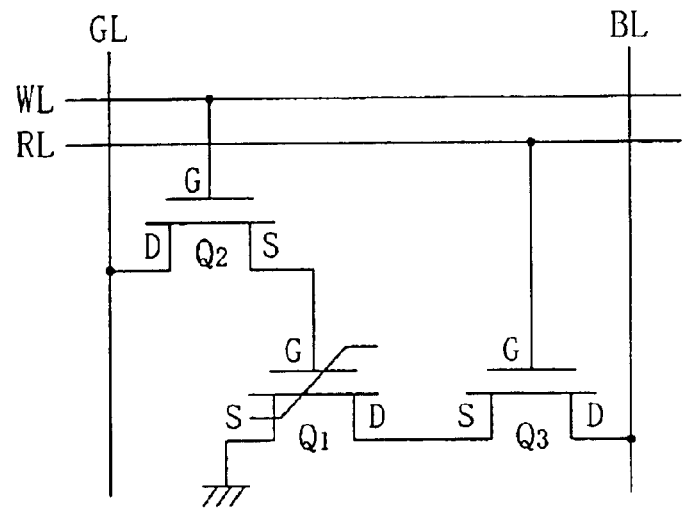
FIG. 6 is a diagram for showing the circuit configuration of a conventional nonvolatile semiconductor memory.
FIG. 7 is a diagram for illustrating operations for erasing, writing and reading data in a method for driving the conventional nonvolatile semiconductor memory.

FIG. 5 shows the plane structure of a semiconductor chip 1 mounting a memory cell array including the semiconductor memory of this embodiment. On the semiconductor chip 1, a memory cell array 2, a row driver 3, a column driver 4, an I/F circuit 5 and a DC—DC converter 6 are formed.

A power voltage introduced from the outside to a VDD terminal on the semiconductor chip 1 and a ground voltage introduced from the outside to a GND terminal on the semiconductor chip 1 are respectively supplied to the row driver 3 and the column driver 4 corresponding to driving circuits for driving the memory cell array 2.

Also, the power voltage introduced to the VDD terminal is supplied to the DC—DC converter 6, which generates a DC voltage $+V_p$, a DC voltage $-V_p$, a DC voltage $V_d$ and a DC voltage $V_r$. The DC voltage $+V_p$ generated by the DC—DC converter 6 is sent to the row driver 3 and the column driver 4, the DC voltage $-V_p$ generated by the DC—DC converter 6 is sent to the column driver 4, and the DC voltage $V_d$ and the DC voltage $V_r$ generated by the DC—DC converter 6 are sent to the column driver 4.

In a data write operation, the DC voltage $+V_p$ or $-V_p$ generated by the DC—DC converter 6 is supplied as a first voltage to the gate electrode 15 of the MFIS transistor, so as to change the polarized state of the ferroelectric film 14.

In a data read operation, the DC voltage $V_d$ generated by the DC—DC converter 6 or the ground voltage 0 V introduced to the GND terminal is supplied as a second voltage to the n-type dopant diffusion layers 12 serving as the drain and source of the MFIS transistor.

What is claimed is:

1. A method for driving a semiconductor memory composed of an MFS transistor including a field effect transistor having a gate electrode formed on a ferroelectric film or an MFIS transistor including a field effect transistor having a gate electrode formed on a multi-layer film of a ferroelectric film and a dielectric film, comprising the steps of:

writing a data in said semiconductor memory by changing a polarized state of said ferroelectric film by applying a voltage to said gate electrode; and reading a data written in said semiconductor memory by detecting a current change appearing between a drain and a source of said field effect transistor by applying a voltage between the drain and the source of said field effect transistor with a voltage applied to said gate electrode, wherein magnitude of the voltage applied between the drain and the source of said field effect transistor in the step of reading a data is set within a range, such that a drain-source current of said field effect transistor increases as a drain-source voltage thereof increases under the condition that the voltage/current characteristics of said field effect transistor change due to a reduction in polarization and disappearance of charges after being programmed.

2. A method for driving a semiconductor memory composed of an MFMIS transistor including a ferroelectric capacitor formed above a gate electrode of a field effect transistor and having a control gate composed of an upper electrode of said ferroelectric capacitor, comprising the steps of:

writing a data in said semiconductor memory by changing a polarized state of a ferro electric film of said ferroelectric capacitor by applying a voltage to said control gate; and reading a data written in said semiconductor memory by detecting a current change appearing between a drain and a source of said field effect transistor by applying a voltage between the drain and the source of said field effect transistor with a voltage applied to said control gate, wherein magnitude of the voltage applied between the drain and the source of said field effect transistor in the step of reading a data is set within a range, such that a drain-source current of said field effect transistor increases as a drain-source voltage thereof increases under the condition that the voltage/current characteristics of said field effect transistor change due to a reduction in polarization and disappearance of charges after being programmed.

* * * * *

UNITED STATES PATENT AND TRADEMARK OFFICE
CERTIFICATE OF CORRECTION

PATENT NO.    : 6,771,530 B2
DATED         : August 3, 2004
INVENTOR(S)   : Yoshihisa Kato et al.

It is certified that error appears in the above-identified patent and that said Letters Patent is hereby corrected as shown below:

Column 7,
Line 2, "ferro electric" should read -- ferroelectric --

Signed and Sealed this

Seventh Day of June, 2005

JON W. DUDAS
*Director of the United States Patent and Trademark Office*